(12) United States Patent
Dyer et al.

(10) Patent No.: US 7,816,231 B2
(45) Date of Patent: Oct. 19, 2010

(54) DEVICE STRUCTURES INCLUDING BACKSIDE CONTACTS, AND METHODS FOR FORMING SAME

(75) Inventors: Thomas W. Dyer, Pleasant Valley, NY (US); Haining Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 897 days.

(21) Appl. No.: 11/468,068

(22) Filed: Aug. 29, 2006

(65) Prior Publication Data

US 2008/0054313 A1 Mar. 6, 2008

(51) Int. Cl.
*H01L 21/3205* (2006.01)
*H01L 21/4763* (2006.01)

(52) U.S. Cl. .................. 438/443; 438/311; 438/675

(58) Field of Classification Search .................. 438/311, 438/401, 443, 462, 464, 618, 620, 672, 675
See application file for complete search history.

(56) References Cited

U.S. PATENT DOCUMENTS

| | | | |
|---|---|---|---|
| 6,773,952 B2 | 8/2004 | Armbrust et al. | |
| 7,049,695 B1 | 5/2006 | Pogge | |
| 7,265,402 B2 * | 9/2007 | Koyanagi | 257/292 |
| 2004/0232554 A1 * | 11/2004 | Hirano et al. | 257/758 |
| 2007/0275533 A1 * | 11/2007 | Vaed et al. | 438/329 |
| 2007/0278619 A1 * | 12/2007 | Clevenger et al. | 257/532 |
| 2008/0006850 A1 * | 1/2008 | Ribnicek et al. | 257/213 |

FOREIGN PATENT DOCUMENTS

JP          05-055357     *  3/1993

* cited by examiner

*Primary Examiner*—Zandra Smith
*Assistant Examiner*—Pamela E Perkins
(74) *Attorney, Agent, or Firm*—Scully, Scott, Murphy & Presser, P.C.; H. Daniel Schnurmann (57) ABSTRACT

The present invention relates to device structures having backside contacts that extend from a back surface of a substrate through the substrate to electrically contact frontside semiconductor devices. The substrate preferably further includes one or more alignment structures located therein, each of which is sufficiently visible at the back surface of the substrate. In this manner, backside lithographic alignment can be carried out using such alignment structures to form at least one back contact opening in a patterned resist layer over the back surface of the substrate. The formed back contact opening is lithographically aligned with the front semiconductor device and can be etched to form a back contact via that extends from the back surface of the substrate onto the front semiconductor device. Filling of the back contact via with a conductive material results in a conductive back contact that electrically contacts the front semiconductor device.

6 Claims, 13 Drawing Sheets

DEVICE STRUCTURES INCLUDING BACKSIDE CONTACTS, AND METHODS FOR FORMING SAME

FIELD OF THE INVENTION

The present invention in general relates to device structures containing backside conductive contacts. More specifically, the present invention relates to device structures having conductive contacts that extend from a back surface of a substrate through the substrate to contact semiconductor devices located on a front surface of the substrate, and methods for forming such device structures.

BACKGROUND OF THE INVENTION

Backside contacts have been conventionally provided in the integrated circuit (IC) chip to facilitate heat dissipation from the IC chip to a thermal sink located on a back surface of the IC chip. See, for example, U.S. Pat. No. 6,773,952 issued on Aug. 10, 2004 to Armburst et al. for "SEMICONDUCTOR CHIP STRUCTURES WITH EMBEDDED THERMAL CONDUCTORS AND A THERMAL SINK DISPOSED OVER OPPOSING SUBSTRATE SURFACES" and U.S. Pat. No. 7,049,695 issued on May 23, 2006 to Pogge for "METHOD AND DEVICE FOR HEAT DISSIPATION IN SEMICONDUCTOR MODULES."

However, such conventional backside contacts do not directly contact any semiconductor devices located on the front surface of the IC chip, and they do not perform any function besides facilitating heat dissipation.

SUMMARY OF THE INVENTION

The present invention provides backside contacts that extend from a back surface of a substrate through the substrate to electrically contact semiconductor devices located on a front surface of the substrate. Correspondingly, additional metal interconnects and semiconductor devices can be formed over the back surface of the substrate, while the backside contacts electrically couple such additional metal interconnects and semiconductor devices with the frontside semiconductor devices to achieve significantly increased functionality and device density.

In one aspect, the present invention relates to a device structure comprising a substrate having a front surface and a back surface, wherein the front surface of the substrate comprises at least one front semiconductor device, and wherein at least one conductive back contact extends from the back surface through the substrate to terminate at and electrically contact to at least one front semiconductor device.

Preferably, the device structure of the present invention further comprises one or more alignment structures, each of which is located in the substrate and is sufficiently visible at the back surface of the substrate for backside lithographic alignment. The alignment structures can be, for example, one or more alignment marks that extend from the front surface through the substrate to the back surface.

The device structure may comprise any suitable types of front semiconductor devices. Preferably, but not necessarily, the device structure comprises a front field effect transistor (FET), which comprises a source region, a drain region, a channel region, and a gate conductor. The source, drain, and channel regions of the front FET are located in a front active device region in the substrate, and the gate conductor of the front FET comprises a first portion overlaying the channel region and a second portion overlaying an isolation region adjacent to the front active device region.

In a specific embodiment of the present invention, the device structure comprises a back conductive contact that extends from the back surface through the substrate to terminate at and electrically contact either the source region or the drain region of the front FET. For example, when a front surface of the source or drain region of the front FET comprises a front metal silicide layer, the conductive back contact may terminate at the front metal silicide layer. In another example, when a back surface of the source or drain region of the front FET comprises a back metal silicide layer, the conductive back contact may terminate at the back metal silicide layer.

In an independent embodiment of the present invention (i.e., which is independent of, and can be provided either separately from or in addition to, the above-described embodiment), the device structure comprises a back conductive contact that extends through the isolation region to terminate at and electrically contact the second portion of the gate conductor of the front FET. For example, when a front surface of the gate conductor comprises a front metal silicide layer, the conductive back contact may terminate at the front metal silicide layer. In another example, when a back surface of the gate conductor comprises a back metal silicide layer, the conductive back contact may terminate at the back metal silicide layer.

In another independent embodiment of the present invention (i.e., which is independent of, and can be provided either separately from or in addition to, the above-described embodiments), the device structure comprises a back conductive contact that extends from the back surface through the substrate to terminate at and electrically contact the channel region of the front FET.

The device structure of the present invention may comprise at least one back metal interconnect level that is located at the back surface of the substrate and is electrically connected with the at least one front semiconductor device by the at least one conductive back contact. Separately or in addition, the device structure of the present invention may comprise at least one back semiconductor device that is located at the back surface of the substrate and is electrically connected with the at least one front semiconductor device by the at least one conductive back contact.

In another aspect, the present invention relates to a device structure comprising a substrate having a front surface and a back surface, wherein an alignment mark is located in the substrate and extends from the front surface through the substrate to the back surface. Preferably, but not necessarily, the alignment mark comprises a contrast material selected from the group consisting of polysilicon, oxides, nitrides, and mixtures thereof.

In a further aspect, the present invention relates to a method comprising:
  a. forming a substrate having a front surface and a back surface;
  b. forming at least one front semiconductor device at the front surface of the substrate;
  c. forming a patterned resist layer on the back surface of the substrate by lithography, wherein the patterned resist layer defines at least one back contact opening therein that is lithographically aligned with at least one component of the at least one front semiconductor device;
  d. etching the substrate through the at least one back contact opening to form at least one back contact via that extends from the back surface through the substrate onto the at least one component of the at least one front semiconductor device; and e. filling the at least one back contact via with a conductive material to form at least one back conductive contact.

Preferably, but not necessarily, the substrate comprises one or more alignment structures that are sufficiently visible at the back surface of the substrate, so that backside lithographic alignment can be carried out using the alignment structures to lithographically align the at least one back contact opening with the at least one component of the front semiconductor device.

Before formation of the patterned resist layer on the back surface of the substrate, a passivation layer is preferably deposited over the front surface of the substrate to cover the front semiconductor device, and a supporting wafer is preferably bonded to the passivation layer to support the substrate at the front surface thereof.

When the substrate of the present invention has a semiconductor-on-insulator (SOI) configuration and comprises a front semiconductor device layer, a buried insulator layer, and a back semiconductor substrate layer, the back semiconductor substrate layer can be completely removed to expose a back surface of the buried insulator layer before formation of the patterned resist layer thereon, and at least one back metal interconnect level can be formed over the exposed back surface of the buried insulator layer after formation of the at least one back conductive contact, so that the back conductive contact electrically connects the front semiconductor device with the back metal interconnect level. Alternatively, the back semiconductor substrate layer can be thinned to form a back semiconductor device layer before formation of the patterned resist layer thereon, and at least one back semiconductor device can be formed in the back semiconductor device layer after formation of the at least one back conductive contact, so that the back conductive contact electrically connects the front semiconductor device with the back semiconductor device.

Other aspects, features and advantages of the invention will be more fully apparent from the ensuing disclosure and appended claims.

DETAILED DESCRIPTION OF THE INVENTION, AND PREFERRED EMBODIMENTS THEREOF

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The present invention provides backside conductive contacts that extend from a back surface of a substrate through the substrate to electrically contact semiconductor devices located on a front surface of the substrate. Such backside conductive contacts bring the front and back surfaces of the substrate into electrical contact with each other. Correspondingly, semiconductor devices and metal levels can be fabricated both on the front and back surfaces of a substrate to form an integrated circuit (IC) chip with significantly increased functionality and device density.

Figure 1:
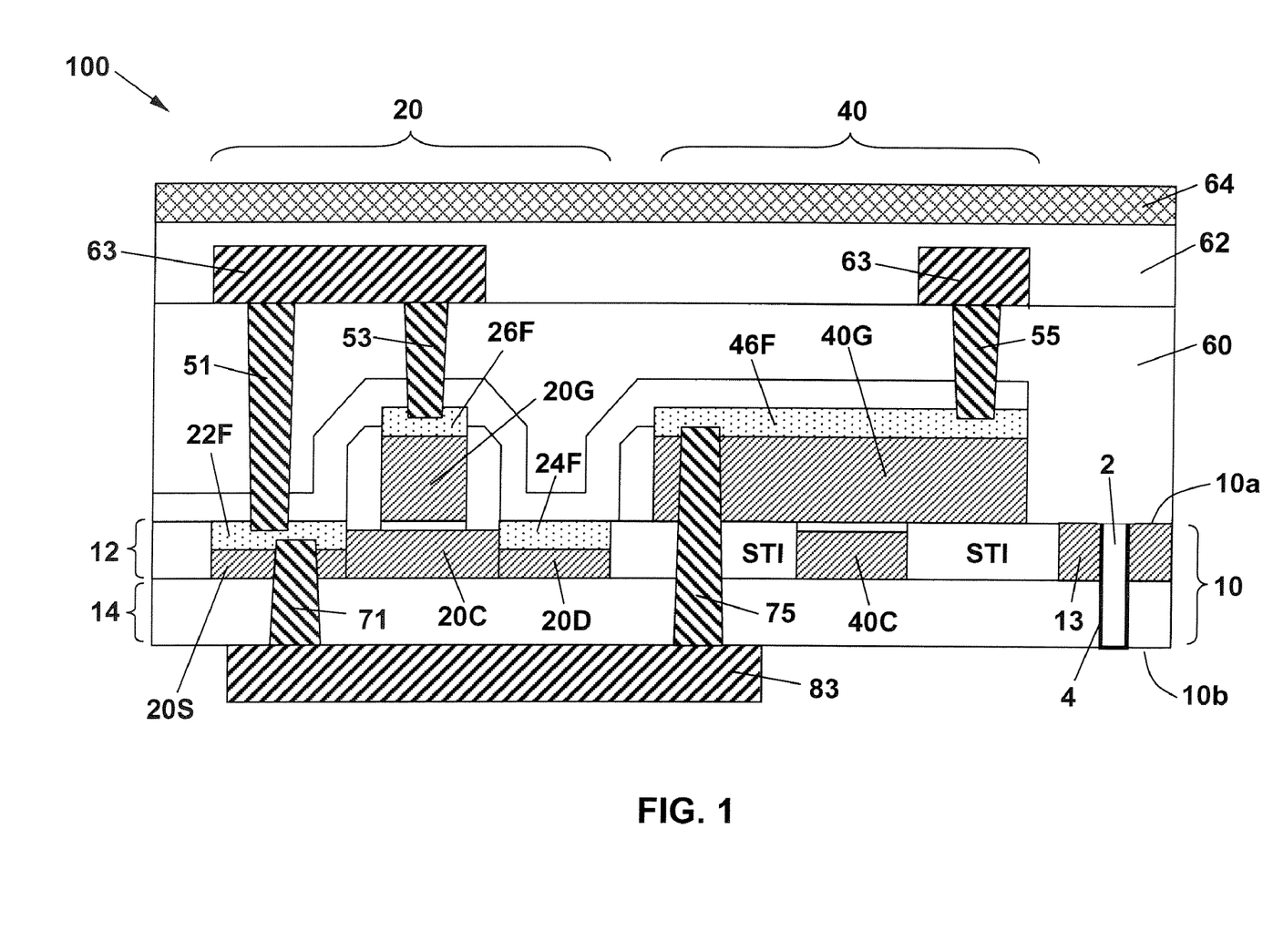
FIG. 1 shows a cross-sectional view of an exemplary device structure containing multiple conductive back contacts, which extend from a back surface of a substrate through the substrate to terminate at front metal silicide layers of field effect transistors (FETs) that are located on a front surface of the substrate, according to one embodiment of the present invention.

Reference is first made to FIG. 1, which shows a cross-sectional view of an exemplary device structure 100 that comprises a substrate 10 with a front surface 10a and a back surface 10b. The substrate 10 shown in FIG. 1 has a semiconductor-on-insulator (SOI) configuration and comprises a front semiconductor device layer 12 overlaying an insulator layer 14.

The front semiconductor device layer 12 may comprise any semiconductor material including, but not limited to: Si, SiC, SiGe, SiGeC, Ge alloys, GaAs, InAs, InP, other III-V or II-VI compound semiconductors, or organic semiconductor structures. In some embodiments of the present invention, it is preferred that the front semiconductor device layer 12 be composed of a Si-containing semiconductor material, i.e., a semiconductor material that includes silicon. The front semiconductor device layer 12 may be doped, undoped, or contain both doped and undoped regions therein (not shown).

The insulator layer 14 may comprise any suitable insulator material(s), and it typically comprises an oxide, a nitride, or an oxynitride in either a crystalline phase or a non-crystalline phase. The physical thickness of the insulator layer 14 may range from about 10 nm to about 1000 nm, and more preferably from about 20 nm to about 500 nm.

It is important to note that although FIG. 1 illustrates a bi-layered SOI substrate 10, the present invention is not limited to such a specifically illustrated SOI configuration. Various other substrate structures can be readily used in the present invention, including, but not limited to: bulk semiconductor substrates, tri-layered SOI substrates comprising a buried insulator layer sandwiched between front and back semiconductor device layers, and SOI substrates having more than three layers. A tri-layered SOI substrate comprising a buried insulator layer sandwiched between front and back semiconductor device layers (not shown) is particularly preferred for certain applications, because semiconductor devices can be formed in both the front and back semiconductor device layers of such a tri-layered SOI substrate, and the overall device density can be significantly increased. Further, hybrid substrate structures with different surface crystallographic orientations for formation of high performance complementary metal-oxide-semiconductor (CMOS) devices are also contemplated by the present invention.

The front semiconductor device layer 12 comprises multiple active device regions, in which semiconductor devices, such as the first and second field effect transistors (FETs) 20 and 40, can be formed. The active device regions are isolated from each other by isolation regions, which may be either trench isolation regions or field oxide isolation regions. The trench isolation regions, preferably shallow trench isolation (STI) regions as shown in FIG. 1, are formed utilizing a conventional trench isolation process well known to those skilled in the art. For example, lithography, etching and filling of the trenches with a trench dielectric may be used in forming the trench isolation regions. Optionally, a liner may be formed in the trenches prior to trench fill, and a densification step may be performed after the trench fill and a planarization process may follow the trench fill as well. The field oxide regions may be formed utilizing a so-called local oxidation of silicon process. The front semiconductor device layer 12 may also comprise one or more non-active semiconductor regions 13 with no semiconductor devices formed therein, as shown in FIG. 1.

The first and second FETs 20 and 40, which are located over the front surface 10a of the substrate 10 and are therefore referred to hereinafter as the front FETs, comprise substantially the same FET components, such as, for example, source regions, drain regions, channel regions, gate stacks overlaying the channel regions, source/drain/gate metal silicide layers, etc. However, because the first and second front FETs 20 and 40 are arranged in a perpendicular relationship to each other, FIG. 1 shows different cross-sectional views of the first and second front FETs 20 and 40. On one hand, FIG. 1 shows a cross-sectional view of the first front FET 20 along its current flow direction, so that the source region 20S, the drain region 20D, the channel region 20C, the gate conductor 20G, and the source/drain/gate metal silicide layers 22F, 24F, 26F of the first front FET 20 can be seen in FIG. 1. On the other hand, FIG. 1 shows a cross-sectional view of the second front FET 40 perpendicular to its current flow direction, so that only the channel region 40C, the gate conductor 40G, and the gate metal silicide layer 46F of the second front FET 40 can be seen in FIG. 1. From the different cross-sectional views shown by FIG. 1, it can be readily appreciated that the source, drain, and channel regions of the first and second front FETs 20 and 40 are located in the respective active device regions in the front semiconductor device layer 12 of the substrate 10, while the gate conductors of the first and second front FETs 20 and 40 extend over the respective active device regions and onto adjacent isolation regions.

First and second interlevel dielectric (ILD) layers 60 and 62, respectively, are formed over the entire front surface 10a of the substrate 10 to cover both front FETs 20 and 40, as shown in FIG. 1. The ILD layers 60 and 62 may be deposited by any suitable methods, such as chemical vapor deposition (CVD), and it may comprise any suitable interlevel dielectric materials, which include, but are not limited to: silicon dioxide, such as an oxide deposited from a tetraethylorthosilicate (TEOS) precursor, borophosphosilicate glass (BPSG), or undoped silicate glass (USG).

A first metal level, which comprises metal lines 63, is formed in the second ILD layer 62, and metal contacts 51, 53, and 55 extend through the first ILD layer 60 to electrically connect respective components of the front FETs 20 and 40 (e.g., the source metal silicide layer 22F and the gate metal silicide layer 26F of the first front FET 20, and the gate metal silicide layer 46F of the second front FET 40) with the first metal level in the second ILD layer 62. Note that the device structure 100 may comprise additional metal levels, additional ILD layers, and additional metal contacts (not shown) over the front surface 10a of the substrate 10.

A passivation layer 64, which may comprise an oxide, a nitride, or both, is then formed over the upper-most layer in the device structure 1 00. The passivation layer 64 functions to protect the semiconductor devices and metal interconnects on the front surface 10b of the substrate 10 during backside processing, as described in greater details hereinafter.

The device structure 100 of FIG. 1 further comprises conductive back contacts 71 and 75, which extend from the back surface 10b through the substrate 10 to terminate at and electrically connect the front FETs 20 and 40 with one or more metal lines 83 or semiconductor devices (not shown) that are located over the back surface 10b of the substrate 10. In this manner, the back surface 10b of the substrate 10 is brought into electrical contact with its front surface 10a by such conductive back contacts 71 and 75, and semiconductor devices and metal levels can therefore be fabricated on the back surface 10b to increase the overall functionality and device density of the device structure 100.

Specifically, the first conductive back contact 71 shown in FIG. 1 extends from the back surface 10b through the insulator layer 14 and terminates at the front metal silicide layer 22F of the source region 20S of the first front FET 20. The second conductive back contact 75 shown in FIG. 1 extends from the back surface 10b through the insulator layer 14 and a STI region in the front semiconductor device layer 12 and terminates at the front metal silicide layer 46F of the gate conductor 40G of the second front FET 40. Correspondingly, the source region 20S of the first front FET 20 and the gate conductor 40G of the second front FET 40 are electrically connected with the backside metal line 83 through the contacts 71 and 75. The device structure 100 may comprise any additional number of conductive back contacts (not shown) that respectively contact other components of the front FETs 20 and 40, and additional metal levels (not shown) or semiconductor devices (not shown) can also be formed over the back surface 10b of the substrate 10.

In order to ensure the proper alignment between the conductive back contacts 71 and 75 and the respective components of the front FETs 20 and 40, the substrate 10 of the present invention may further comprise one or more alignment structures that are sufficiently visible at the back surface 10b of the substrate 10 for backside lithographic alignment.

For example, the substrate 10 as shown in FIG. 1 comprises an alignment mark 2, which is located in a non-active semiconductor region 13 and extends from the front surface 10a through both the front semiconductor device layer 12 and the insulator layer 14 to the back surface 10b. Such an alignment mark 2 is therefore visible from both the front and back surfaces 10a and 10b of the substrate 10 and can be used for both front and back side lithographic alignment. Preferably, but not necessarily, the alignment mark 2 comprises a contrast liner 4, which is composed of one or more contrast materials, such as polysilicon, oxides, nitrides, and mixtures thereof.

Alternatively, the alignment mark 2 may be composed entirely of such contrast material(s) without any liner. The contrast material(s) in the alignment mark 2 functions to increase the visibility of the alignment mark 2 during lithographic alignment.

Note that the alignment mark 2 as shown in FIG. 1 is not required for the device structures of the present invention. Any other alignment structure that is sufficiently visible at the back surface 10b of the substrate 10 can be used for practicing the present application in place of the alignment mark 2. For example, when the insulator layer 14 of the substrate 10 is sufficiently transparent, the STI regions located in the front semiconductor device layer 12 may be used as the alignment structures for the backside lithographic alignment. The trench liners, which are typically included in the STI regions, can be formed of above-mentioned contrast material(s) to increase the visibility of the STI regions at the back surface 10b of the substrate 10.

The device structure 100 shown by FIG. 1 can be readily formed by exemplary processing steps that are illustrated in greater details hereinafter with reference to FIGS. 2-10.

Figure 2:
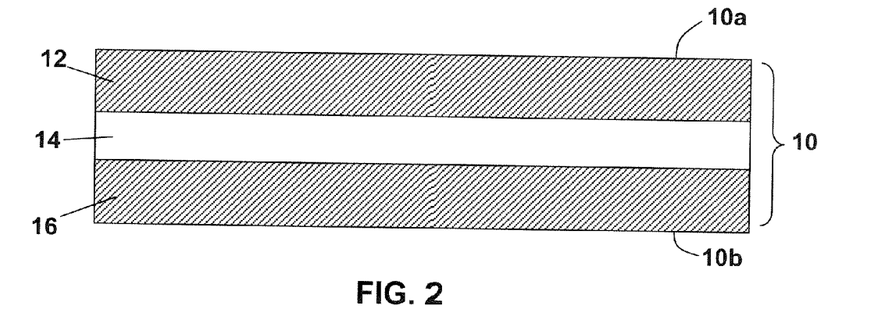
FIGS. 2-10 are cross-sectional views that illustrate exemplary processing steps for forming the device structure as shown in FIG. 1, according to one embodiment of the present invention.
Figure 3:
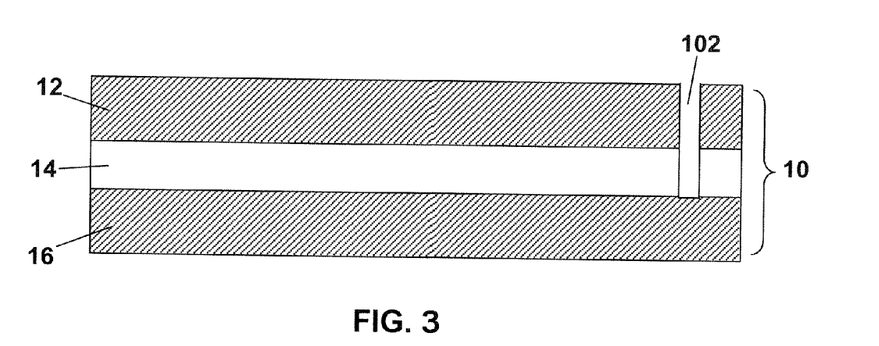
Figure 4:
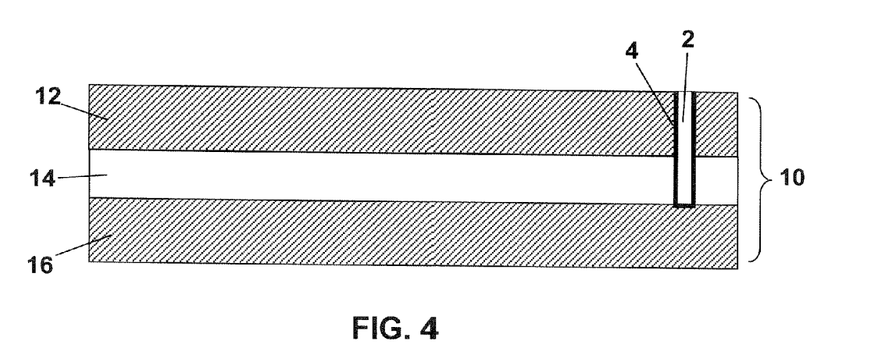

First, an SOI substrate 10 is provided, which has a front surface 10a and a back surface 10b and comprises a front semiconductor device layer 12, an insulator layer 14, and a semiconductor substrate layer 16, as shown in FIG. 2. Next, a via 102 is formed in the SOI substrate 10 by conventional lithography and etching steps. Via 102 extends through the front semiconductor 12 and the insulator layer 14 and stops at the semiconductor substrate layer 16, as shown in FIG. 3. Filling of via 102 then forms the alignment mark 2, as shown in FIG. 4. As mentioned hereinabove, the alignment mark 2 may contain a contrast liner 4, or it may be composed entirely of contrast material(s).

Subsequently, STI regions are formed in the front semiconductor device layer 12, thereby defining multiple active device regions, and optionally a non-active semiconductor region 13 therein. Note that although the alignment mark 2 is located at the non-active semiconductor region 13 in the specific embodiment illustrated herein, the alignment mark 2 can also be located at a STI region, as shown hereinafter in FIGS. 11-16.

Figure 5:
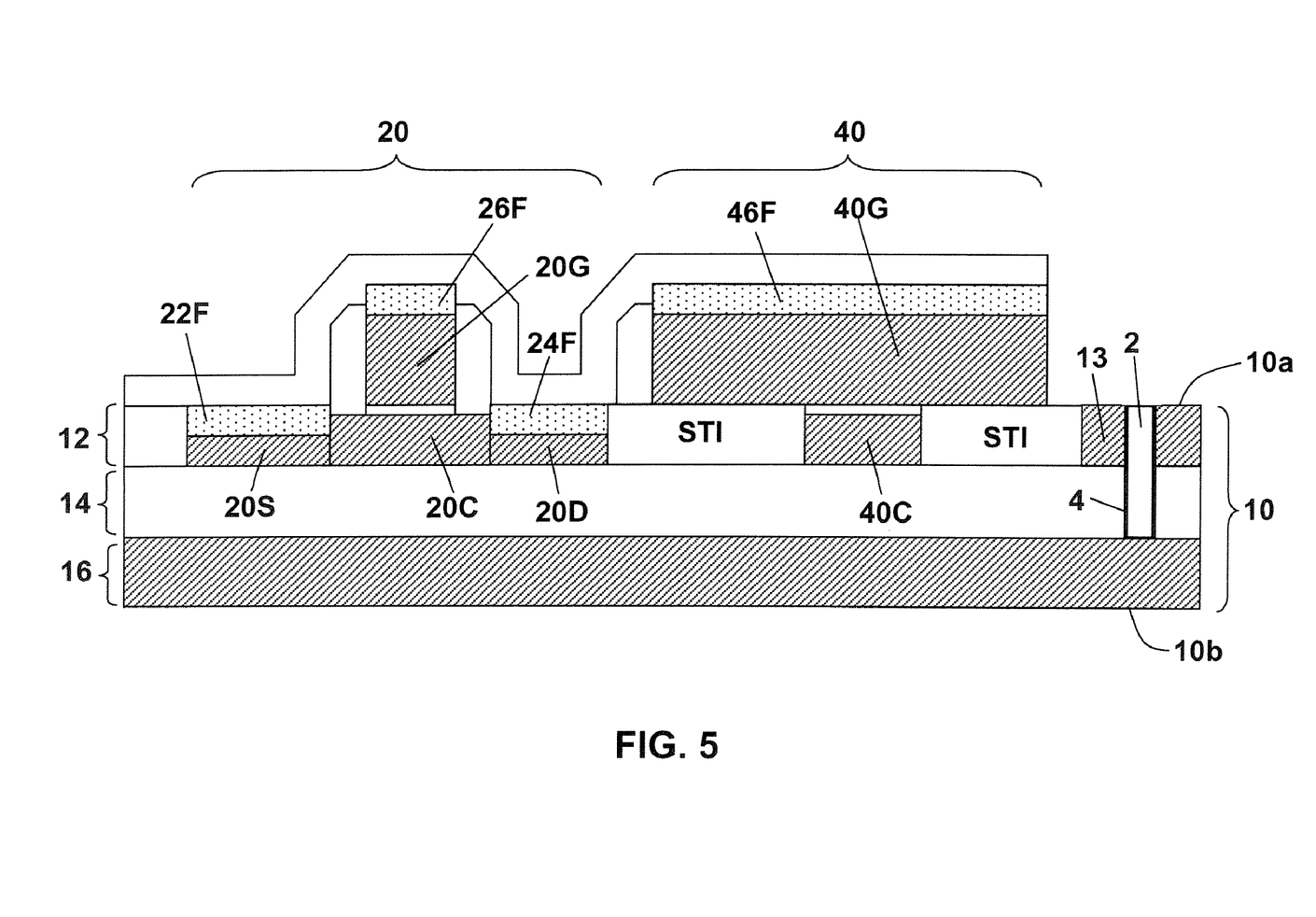
Figure 6:
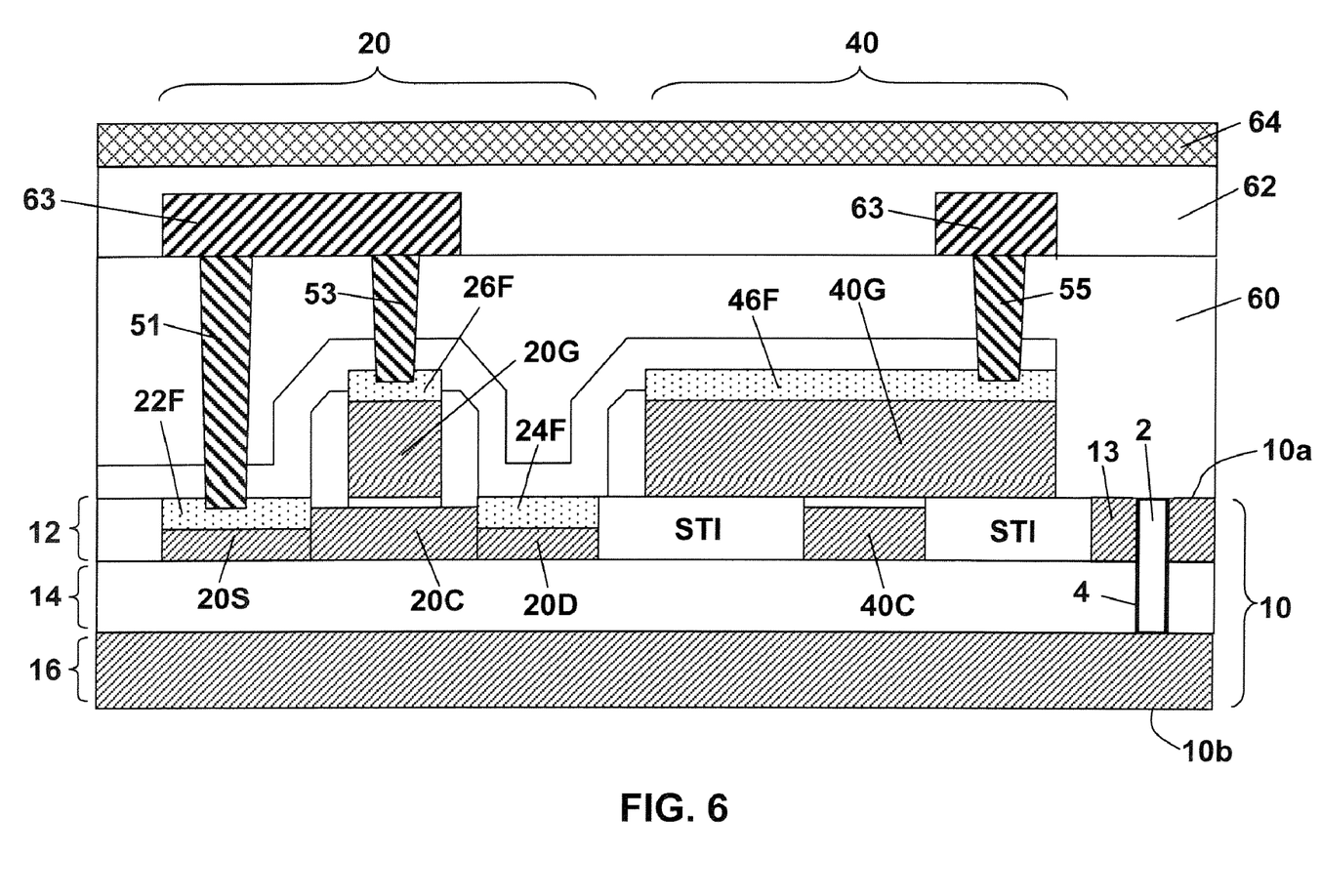

Conventional complementary metal-oxide-semiconductor (CMOS) processing steps are carried out to form the front FETs 20 and 40 on the front surface 10a of the substrate 10, more specifically at the active device regions of the front semiconductor device layer 12, as shown in FIG. 5. Next, conventional back-end-of-line (BEOL) processing steps are carried out to form the ILD layers 60 and 62, the metal contacts 51, 53, and 55 and the metal lines 63, as shown in FIG. 6. The metal contacts 51, 53, and 55 and the metal lines 63 are preferably aligned with the respective components of the front FETs 20 and 40 by using the alignment mark 2 located in the substrate 10.

A passivation layer 64 is then deposited over the second ILD layer 62 to cover the first and second front FETs 20 and 40, the metal lines 63, and the metal contacts 51, 53, and 55, as shown in FIG. 6. The passivation layer may comprise any suitable passivation material, such as oxides, nitrides, and oxynitrides, and it can be readily deposited by any suitable deposition method, including, but not limited to: chemical vapor deposition (CVD), plasma-enhanced CVD (PECVD), atomic layer deposition (ALD), evaporation, reactive sputtering, chemical solution deposition and other like deposition processes. Preferably, but not necessarily, the passivation layer 64 comprises an oxide deposited by a PECVD process. Planarization of the passivation layer 64 can then be carried out using chemical-mechanical polishing (CMP) or other known planarization techniques.

After planarization of the passivation layer 64, the entire structure as shown in FIG. 6 is bonded to a supporting wafer (not shown). In this manner, the back surface 10b of the substrate 10 is exposed for subsequent backside processing, while the semiconductor devices and metal interconnects on the front surface 10a are supported and protected by the passivation layer 64 and the supporting wafer.

Figure 7:
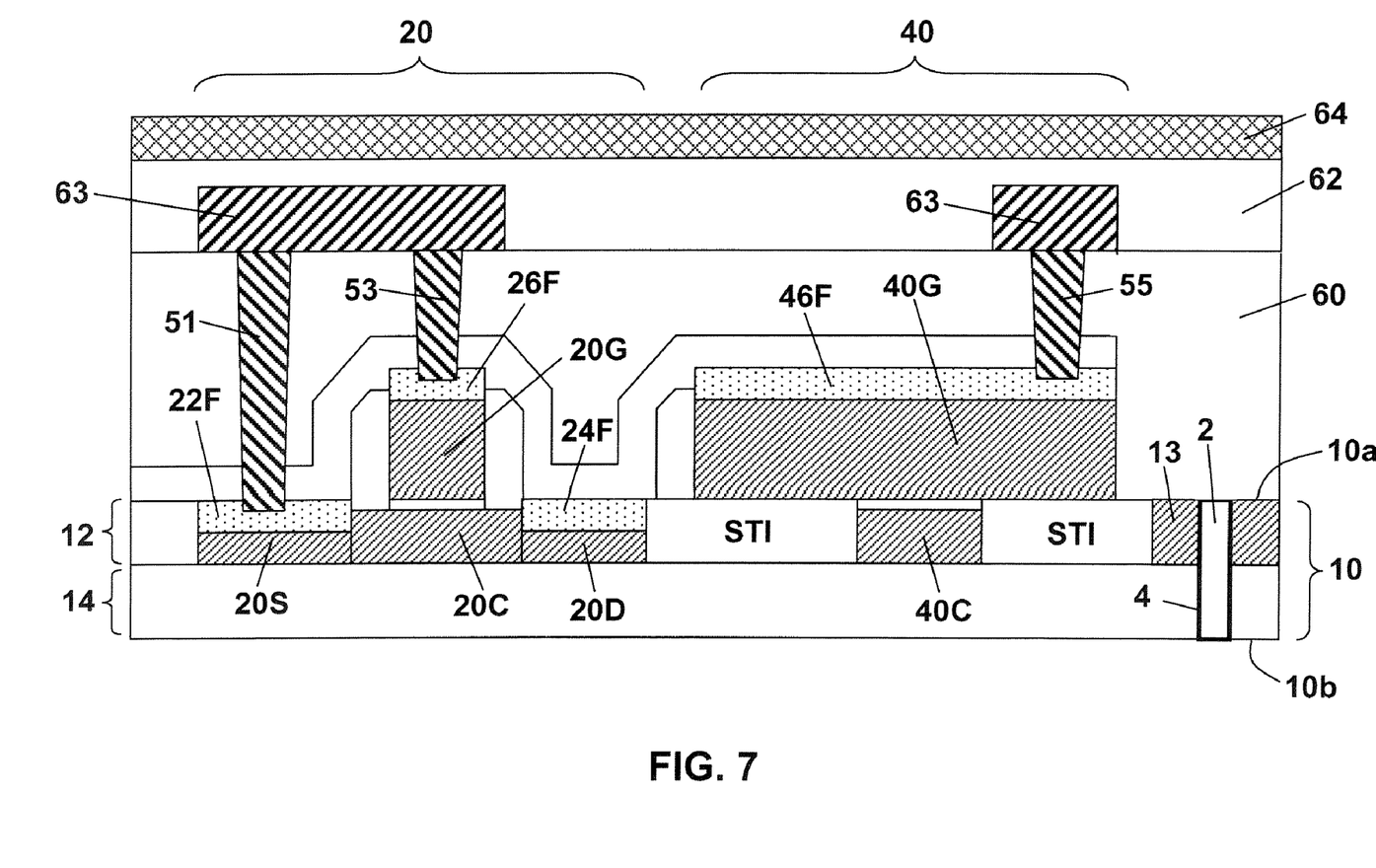
Figure 8:
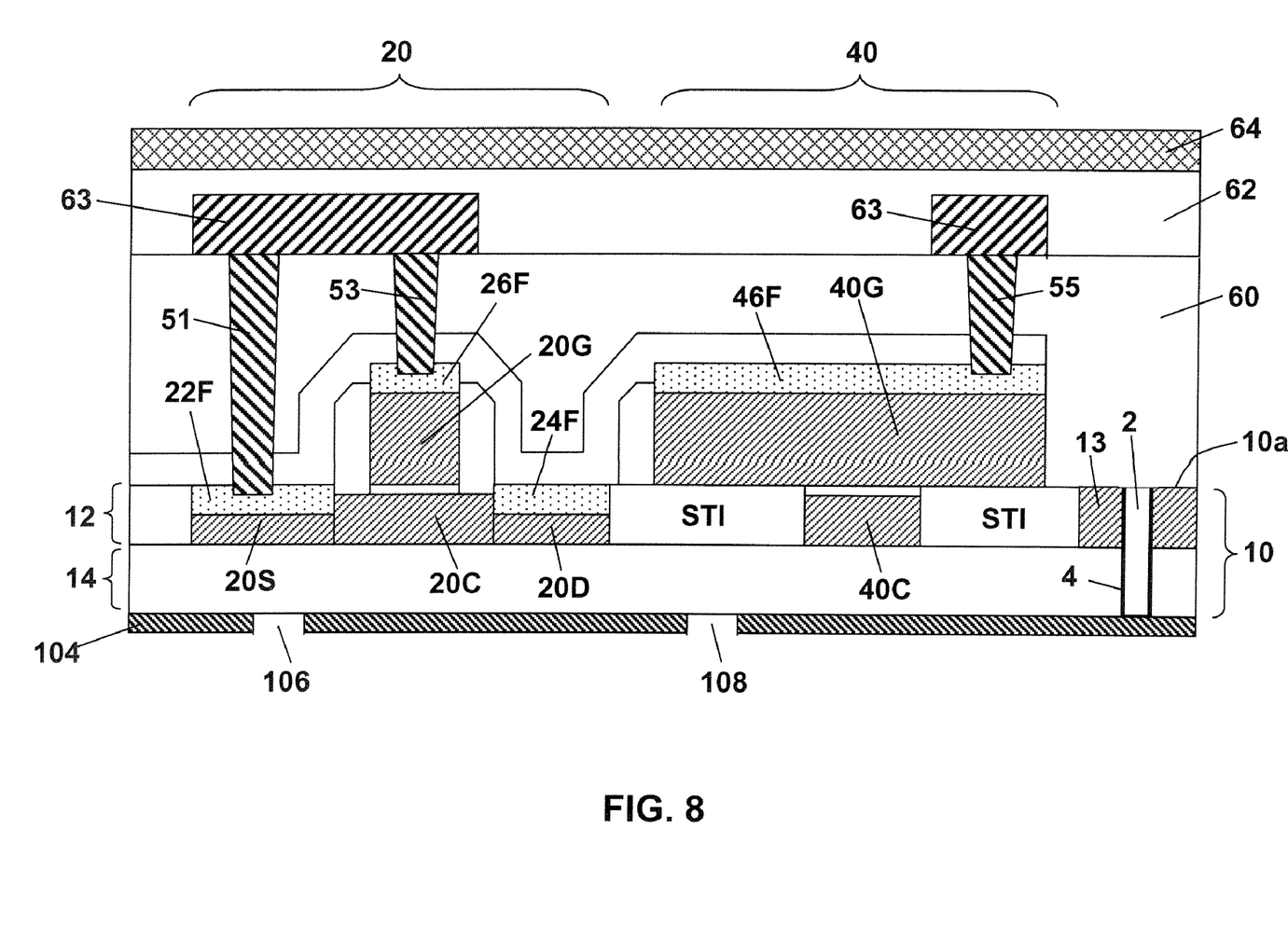

Next, at least a portion of the semiconductor substrate layer 16 is removed by a wafer thinning technique, including, but not limited to: CMP, wafer etching, and/or grinding. In a specific, but not necessary, embodiment of the present invention, the semiconductor substrate layer 16 is completely removed from the substrate 10, so the insulator layer 14 and the alignment mark 2 become exposed at the back surface 10b of the substrate 10, as shown in FIG. 7. In an alternative embodiment of the present invention, the semiconductor substrate layer 16 is thinned substantially to form a back semiconductor device layer (not shown), in which backside semiconductor devices can then be formed.

Subsequently, a patterned photoresist layer 104 is formed over the back surface 10b of the substrate 10 using backside lithography techniques. Specifically, a blanket photoresist layer (not shown) is first deposited over the back surface 10b, which is then exposed to a desired pattern of radiation and developed utilizing a conventional resist developer. The radiation pattern is preferably aligned to respective components of the front FETs 20 and 40 (e.g., the source region 20S of the first front FET 20 and the gate conductor 40G of the second front FET 40) using the alignment mark 2 located in the substrate 10. Consequently, back contact openings 106 and 108, which are lithographically aligned with the respective components of the front FETs 20 and 40, are formed in the photoresist layer 104.

Figure 9:
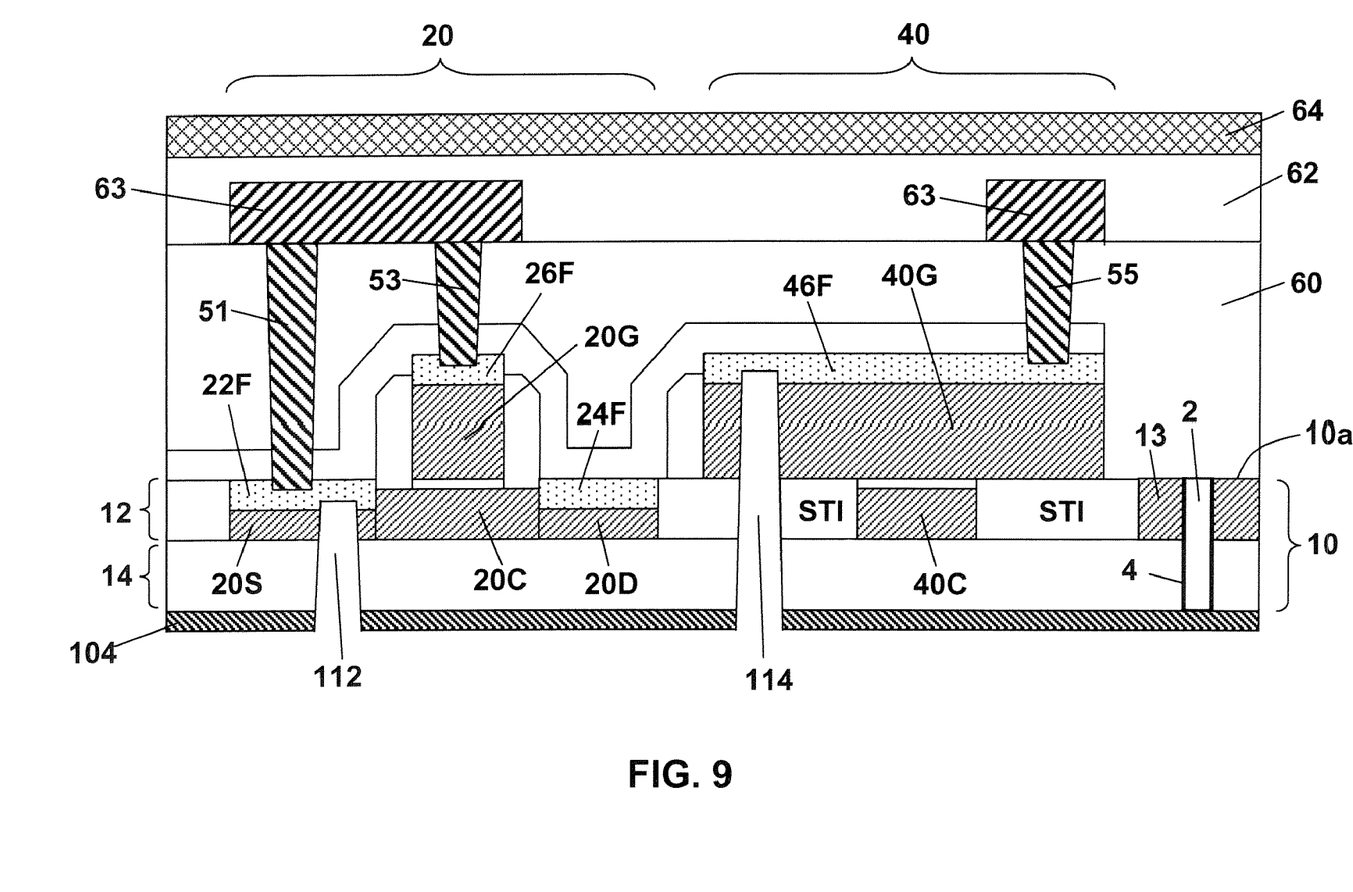

The pattern in the photoresist layer 104 is then transferred to the insulator layer 14, the STI region, and the overlaying semiconductor material(s) by dry and/or wet etching steps, thereby forming back contact vias 112 and 114, as shown in FIG. 9. The back contact vias 112 and 114 extend from the back surface 10b of the substrate through the insulator layer 14 and the front semiconductor device layer 16 and terminate at the front metal silicide layers 22F and 46F of the front FETs, as shown in FIG. 9. Suitable dry etching processes that can be used in the present invention include, but are not limited to: reactive ion etching (RIE), ion beam etching, plasma etching or laser ablation. Suitable wet etching processes that can be used in the present invention include, but are not limited to: KOH-based etching chemistry (which selectively etches semiconductors), $SF_6$-based anistropic etching chemistry (which selectively etches semiconductors), HF-based etching chemistry (which selectively etches insulators). The pattern transfer can be achieved by a single etching step or multiple etching steps, depending on the etching method and etching chemistry employed.

The front metal silicide layers 22F and 46F of the front FETs 20 and 40 function as etch stop layers in this specific embodiment. Consequently, the back contact vias 112 and 114 so formed terminate at such front metal silicide layers 22F and 46F. However, in an alternative embodiment of the present invention, which is to be illustrated hereinafter with reference to FIG. 14, the source region 20S and the gate conductor 40G, which preferably comprise semiconductor material(s), can function as etch stop layers. Correspondingly, back contact vias so formed will then terminate at the source region 20S and the gate conductor 40G before reaching the front metal silicide layers 22F and 46F.

Figure 10:
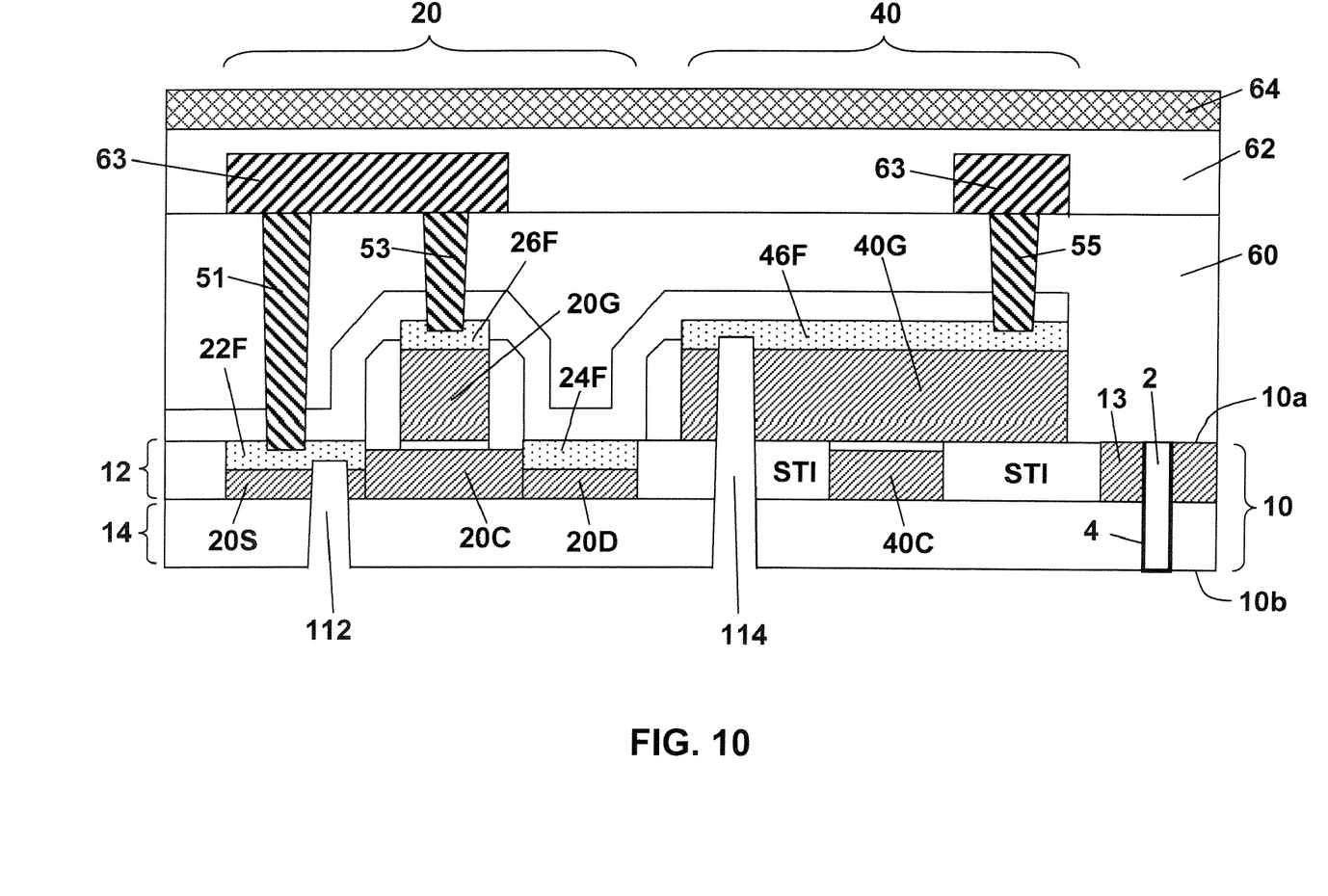

After etching, the patterned photoresist 104 is removed by resist stripping, as shown in FIG. 10, followed by filling the back contact vias 112 and 114 with a conductive material (not shown), such as a metal or a doped semiconductor. The term "metal" as used herein refers to any metal that is either in its elemental form or in a conductive compound form, including pure metals, metal alloys, metal nitrides, metal silicides, etc. Preferred metals that can be used in the present invention include aluminum, tungsten, copper, and their associated alloys, nitrides, and silicides.

The conductive material (not shown) can be deposited by any suitable method known in the art, including, but not limited to: physical vapor deposition (PVD), CVD, electroplating, sputtering, etc. The conductive material (not shown) so deposited not only fills the back contact vias 112 and 114, but also covers the entire back surface 10b of the substrate 10. Subsequently, a patterning process can be carried out to remove excess conductive material from the back surface 10b of the substrate 10, thereby forming the back conductive contacts 71 and 75 in the substrate 10 and the patterned metal line 83 over the substrate back surface 10b, as shown in FIG. 1.

FIGS. 11-15 illustrate several alternative processing steps that can be used in place of those illustrated hereinabove in FIGS. 2-10.

Figure 11:
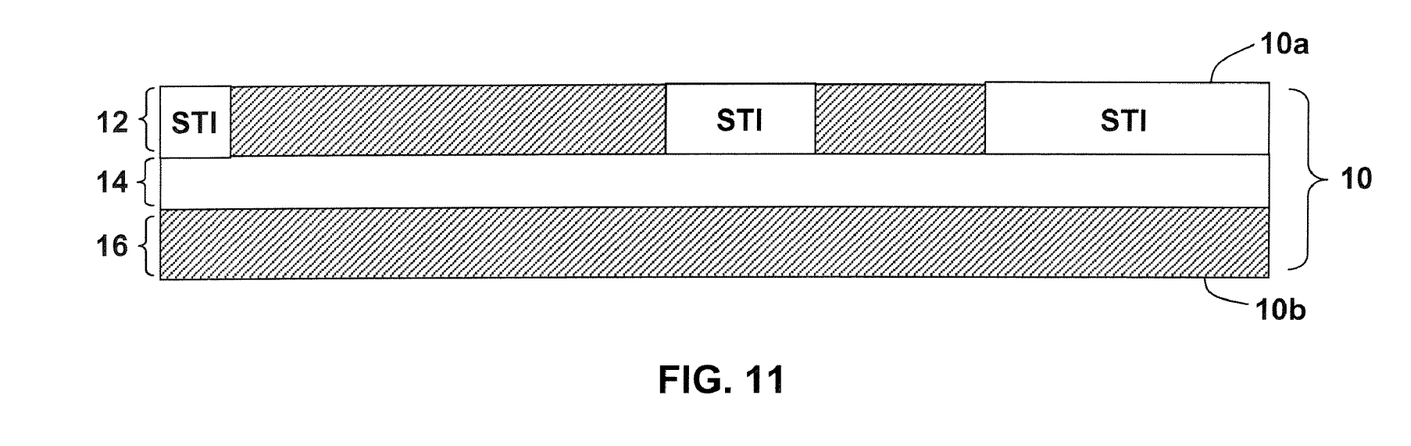
FIGS. 11-15 are cross-sectional views that illustrate alternative processing steps, according to one embodiment of the present invention.
Figure 12:
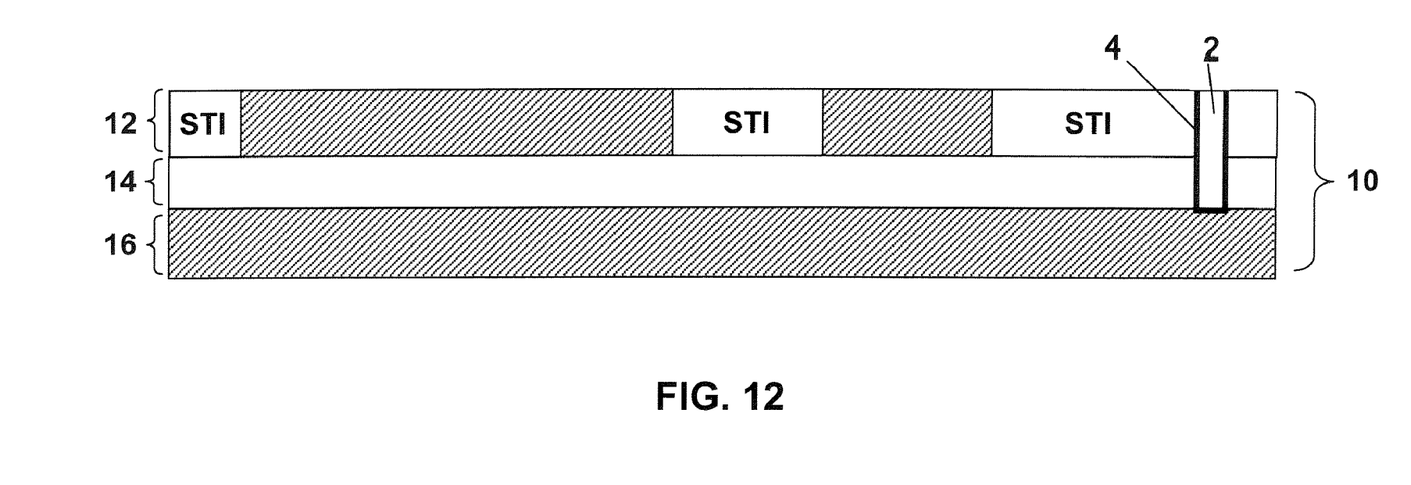

For example, instead of forming the alignment mark 2 through a non-active semiconductor region 13, as shown in FIG. 5, the alignment mark 2 can also be formed through a STI region in the front semiconductor device layer 16. Specifically, STI regions can be first formed in the front semiconductor device layer 16, as shown in FIG. 11, followed by formation of an alignment mark 2 through one of the STI region, as shown in FIG. 12.

Figure 13:
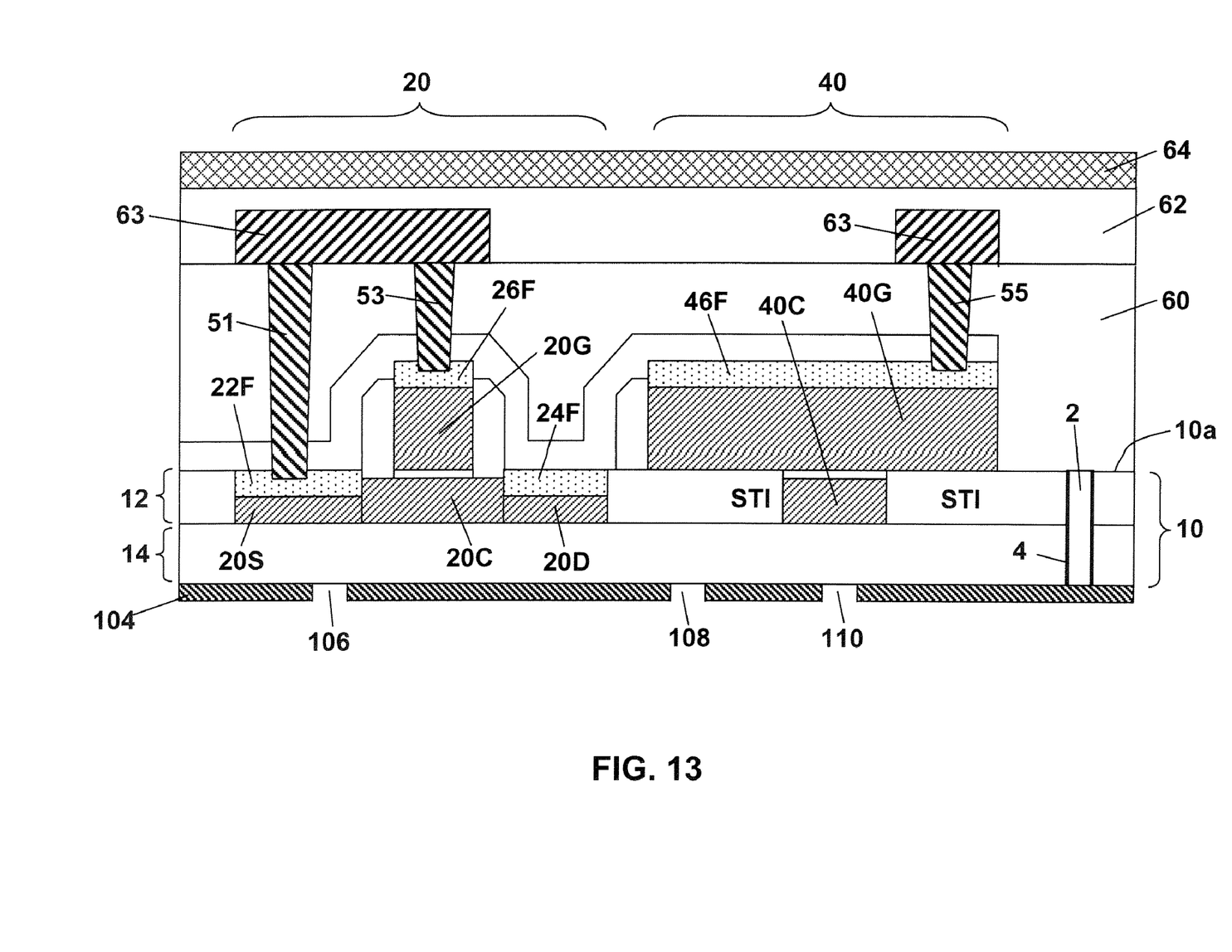

For another example, an additional contact opening 110, which is aligned to the channel region 40C of the second front FET 40, can be formed in the patterned resist layer 104, as shown in FIG. 13. In this manner, an additional conductive back contact can be formed to electrically contact the channel region 40C of the FET 40.

Figure 14:
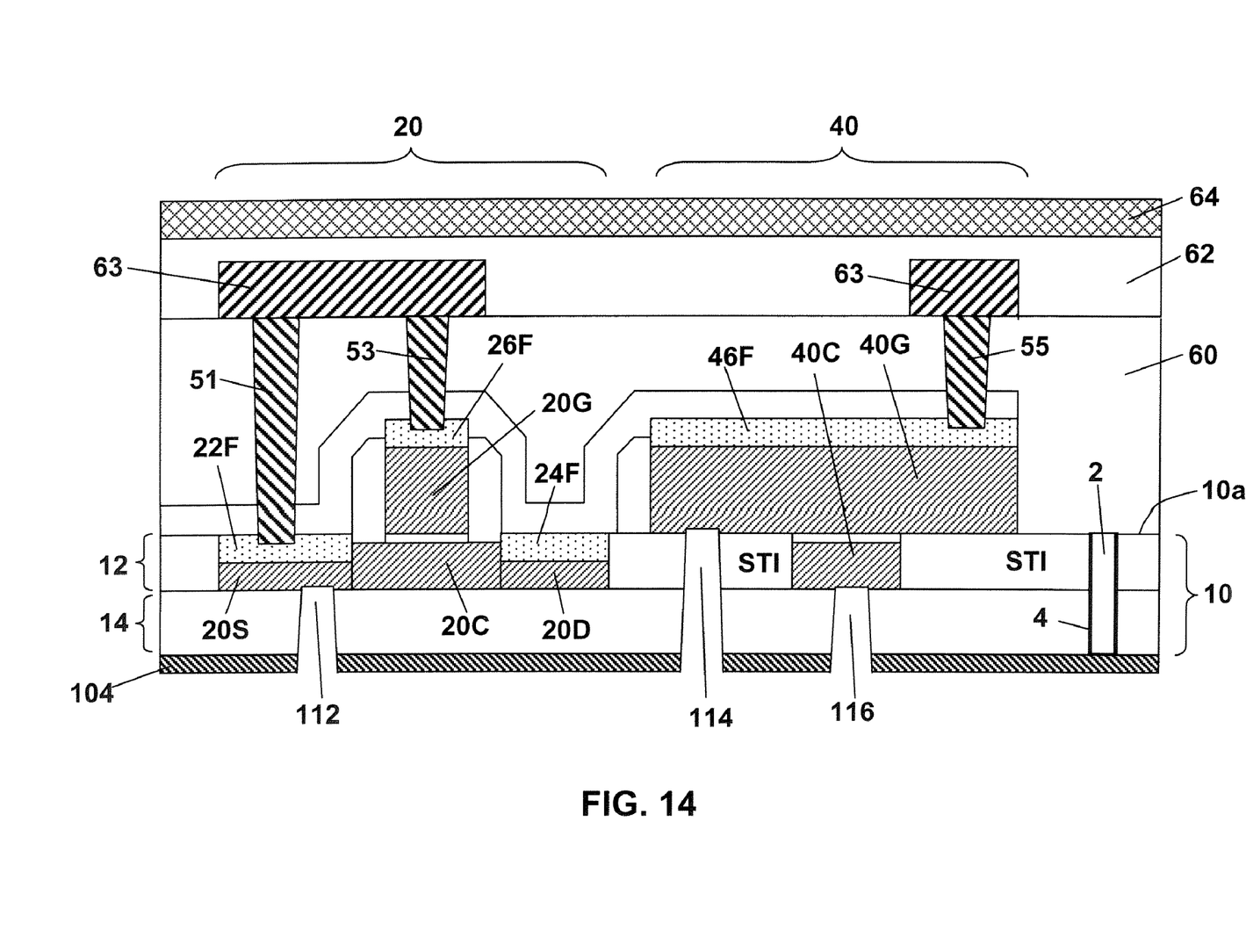
Figure 15:
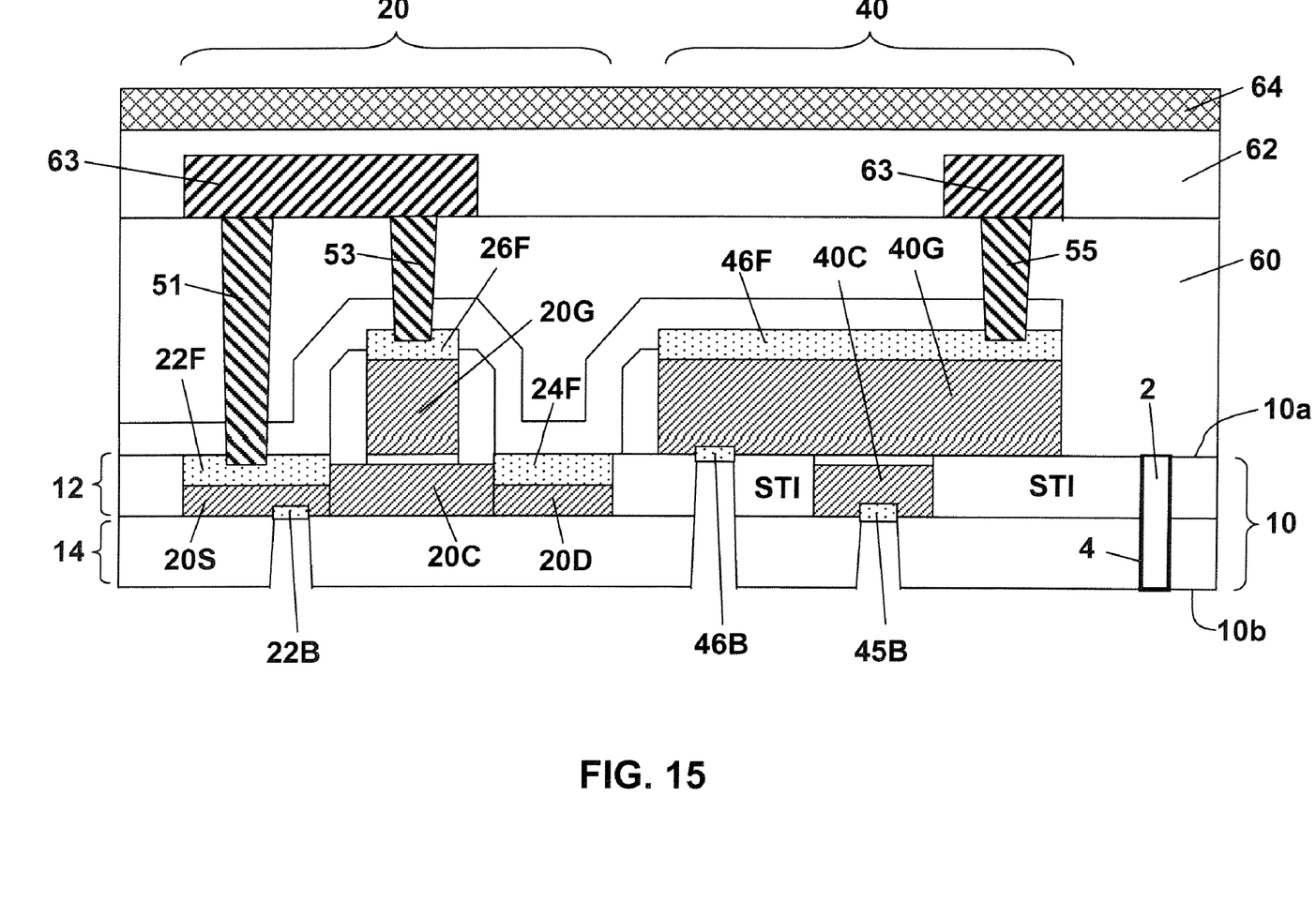

Further, the contact etching process can be carried out using an etching chemistry that selectively etches insulator over semiconductor. Because the source region 20S, the gate conductor 40G, and the channel region 40C comprise semiconductor material(s), the back contact vias 112, 114 and 116 formed by such a contact etching process will terminate at back surfaces of the source region 20S, the gate conductor 40G, and the channel region 40C before reaching the front metal silicide layers 22F and 46F, as shown in FIG. 14. An optional silicidation process may be carried out to form metal silicide layers 22B, 46B, and 45B on the respective back surfaces of the source region 20S, the gate conductor 40G, and the channel region 40C, as shown in FIG. 15.

Figure 16:
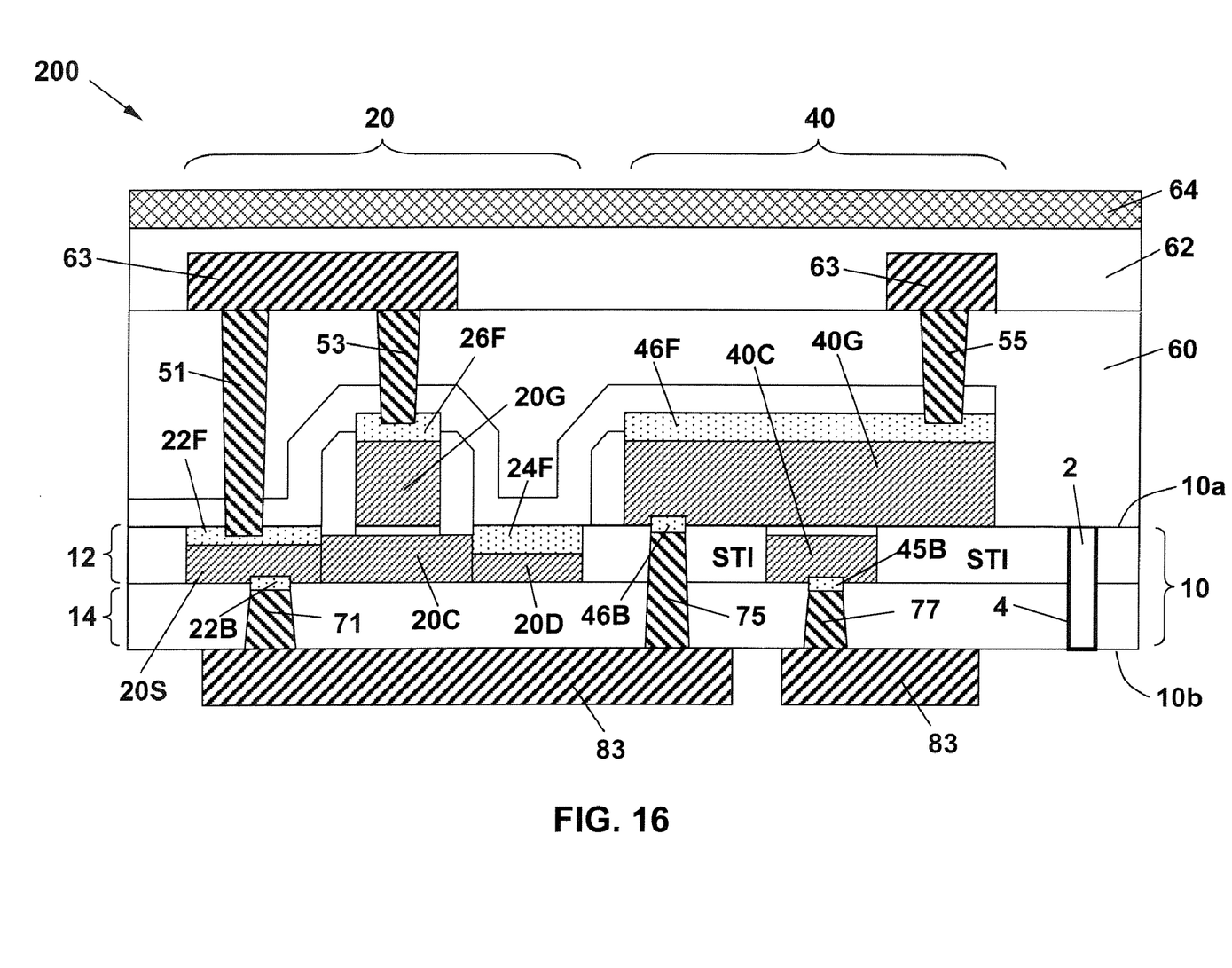
FIG. 16 shows a cross-sectional view of an exemplary device structure formed by the alternative process steps of FIGS. 11-15, which comprises conductive back contacts that extend from the back surface of the substrate through the substrate to terminate at back metal silicide layers of the front FETs, according to one embodiment of the present invention.

Subsequent filling of the back contact vias 112, 114 and 116 with a conductive material and patterning of such a conductive material then forms the conductive back contacts 71, 75, and 77 and the metal lines 83, as shown in FIG. 16.

Note that while FIGS. 1-16 illustratively demonstrate exemplary device structures and exemplary processing steps for forming such device structures, according to specific embodiments of the present invention, it is clear that a person ordinarily skilled in the art can readily modify such a device structure and processing steps for adaptation to specific application requirements, consistent with the above descriptions. For example, while FIGS. 1-16 primarily refers to FETs as the front semiconductor devices, it should be appreciated that other types of front semiconductor devices, such as transistors, capacitors, resistors, diodes, varactors, inductors, etc., can also be used in the present invention. Further, bulk substrates or SOI substrates with more than two layers can also be used in place of the bi-layer SOI substrate as illustrated in FIGS. 1-16.

It is noted that the drawings of the present invention are provided for illustrative purposes and are not drawn to scale.

While the invention has been described herein with reference to specific embodiments, features and aspects, it will be recognized that the invention is not thus limited, but rather extends in utility to other modifications, variations, applications, and embodiments, and accordingly all such other modifications, variations, applications, and embodiments are to be regarded as being within the spirit and scope of the invention.

What is claimed is:

1. A method comprising:
    forming a substrate having a front surface and a back surface and one or more alignment structures that are visible at the back surface of the substrate for backside lithographic alignment, said substrate has a semiconductor-on-insulator (SOI) configuration and comprises a front semiconductor device layer, a buried insulator layer, and a back semiconductor substrate layer;
    forming at least one front semiconductor device at the front surface of the substrate;
    forming a passivation layer over the front surface of the substrate to cover the at least one front semiconductor device;
    bonding a supporting wafer to the passivation layer to support the substrate at the front surface thereof;
    completely removing the back semiconductor layer of the substrate to expose a back surface of the buried insulator layer;
    forming a patterned resist layer on the back surface of the substrate by lithography, wherein the patterned resist layer defines at least one back contact opening therein that is lithographically aligned with at least one component of said at least one front semiconductor device;
    etching the substrate through said at least one back contact opening to form at least one back contact via that extends from the back surface through the substrate onto the at least one component of the at least one front semiconductor device;
    filling the at least one back contact via with a conductive material to form at least one back conductive contact; and
    forming at least one back metal interconnect level over the exposed back surface of the buried insulator layer so that the at least one conductive back contact electrically connects the at least one front semiconductor device with the at least one back metal interconnect level.

2. A method comprising:
    forming at least one front semiconductor device on a front surface of a substrate, said substrate further including a back surface opposing the front surface, and wherein the substrate comprises one or more alignment structures that are visible at the back surface of the substrate for backside lithographic alignment;
    forming a patterned resist layer on the back surface of the substrate by lithography and by using said one or more alignment structures, wherein the patterned resist layer defines at least one back contact opening therein that is lithographically aligned with at least one component of said at least one front semiconductor device;
    etching the substrate through said at least one back contact opening to form at least one back contact via that extends from the back surface through the substrate onto the at least one component of the at least one front semiconductor device; and filling the at least one back contact via with a conductive material to form at least one back conductive contact.

3. The method of claim 2, wherein before formation of the patterned resist layer on the back surface of the substrate, a passivation layer is deposited over the front surface of the substrate to cover the at least one front semiconductor device, and a supporting wafer is bonded to the passivation layer to support the substrate at the front surface thereof.

4. The method of claim 2, wherein the substrate has a semiconductor-on-insulator (SOT) configuration and comprises a front semiconductor device layer, a buried insulator layer, and a back semiconductor substrate layer.

5. The method of claim 4, wherein the back semiconductor substrate layer of the SOT substrate is completely removed to expose a back surface of the buried insulator layer before formation of the patterned resist layer thereover, and wherein at least one back metal interconnect level is formed over the exposed back surface of the buried insulator layer after formation of the at least one conductive back contact, so that the at least one conductive back contact electrically connects the at least one front semiconductor device with the at least one back metal interconnect level.

6. The method of claim 4, wherein the back semiconductor substrate layer of the SOT substrate is thinned to form a back semiconductor device layer before formation of the patterned resist layer thereover, and wherein at least one back semiconductor device is formed in the back semiconductor device layer after formation of the at least one conductive back contact, so that the at least one conductive back contact electrically connects the at least one front semiconductor device with the at least one back semiconductor device.

* * * * *